United States Patent [19]

Poirier et al.

[11] Patent Number: 4,704,614
[45] Date of Patent: Nov. 3, 1987

[54] APPARATUS FOR SCANNING AND MEASURING THE NEAR-FIELD RADIATION OF AN ANTENNA

[75] Inventors: J. Leon Poirier, Chelmsford; Arthur D. Yaghjian, Concord, both of Mass.

[73] Assignee: The United States of America as represented by the Secretary of the Air Force, Washington, D.C.

[21] Appl. No.: 795,400

[22] Filed: Nov. 6, 1985

[51] Int. Cl.$^4$ ............................................. G01R 29/08
[52] U.S. Cl. ...................................... 343/703; 324/95; 340/600
[58] Field of Search .......................... 343/703; 324/95; 455/67, 226, 115; 340/600

[56] References Cited

U.S. PATENT DOCUMENTS

| | | | |
|---|---|---|---|
| 3,641,439 | 2/1972 | Asian | 325/363 |
| 3,787,866 | 1/1974 | Gamertsfelder et al. | 343/703 |
| 3,879,733 | 4/1975 | Hansen et al. | 343/703 X |
| 3,932,745 | 1/1976 | Hartman | 250/216 |
| 4,070,621 | 1/1978 | Bassen et al. | 343/703 X |
| 4,201,987 | 5/1980 | Tricoles et al. | 343/703 |

OTHER PUBLICATIONS

Paris et al., "Basic Theory . . . Measurements", IEEE Trans. on Antenna and Propagation, vol. AP-26, No. 3, May, 1978, pp. 373-379.
"Applications of Probe-Compensated Near-Field Measurement," D. T. Paris et al., *IEEE Tran. A. P.*, vol. 33, pp. 379-389.

*Primary Examiner*—Eugene R. LaRoche
*Assistant Examiner*—Seung Ham
*Attorney, Agent, or Firm*—Richard J. Donahue; Donald J. Singer

[57] ABSTRACT

Apparatus for measuring the near-field radiation of an antenna such that its far-field radiation characteristics can be determined. The invention utilizes the principle of the Foucault pendulum. It uses a bob attached to a long pendulum arm that is free to rotate. Rotation of the earth causes an apparent rotation of the swing plane of the pendulum with a period of T=24/sin (latitude). By attaching a field sensing probe to the pendulum bob and mounting the antenna under the Foucault pendulum, the entire antenna aperture can be scanned without moving the antenna. The motion of the probe covers part of an external sphere centered at the pivot point of the pendulum and having a radius equal to the length of the pendulum. Appropriate transformation of the measured near-field data gives the far-field radiation pattern.

7 Claims, 4 Drawing Figures

APPARATUS FOR SCANNING AND MEASURING THE NEAR-FIELD RADIATION OF AN ANTENNA

STATEMENT OF GOVERNMENT INTEREST

The invention described herein may be manufactured and used by or for the Government for governmental purposes without the payment of any royalty thereon.

BACKGROUND OF THE INVENTION

The present invention concerns apparatus for determining the operating characteristics of large antennas. More particularly, it concerns apparatus for scanning and measuring the near-field radiation of such antennas and thereby determining their far-field radiation patterns.

Near-field scanning as a method of determining the far-field properties of an antenna is well established. The following articles discuss several applications of this concept.

1. D. T. Paris, W. M. Leach, Jr., and E. B. Joy, "Basic Theory of Probe Compensated Near-Field Measurements," IEEE Trans. AP, vol 26, pp. 373-379, May 1978.
2. E. B. Joy, W. M. Leach, Jr., G. P. Rodrigue, and D. T. Paris, "Applications of Probe-Compensated Near-Field Measurements," IEEE Trans. AP vol 26, pp. 379-389, May 1978.
3. Y. Rahmat-Samii, and M. S. Gatti, "Far-Field Patterns of Spaceborne Antennas from Plane-Polar Near-Field Measurements," IEEE Trans. AP, pp. 638-648, vol 33, June 1985.
4. A. D. Yaghjian, Planar Near-Field Measurement Techniques on High Performance Arrays—Part I, Error Analysis for Nonscanning Beam Patterns, Air Force Avionic Laboratory Technical Report, AFAL-TR-75-67, July 1975.

Four distinct methods of near-field scanning have been developed. These are the planar (plane-rectangular), plane-polar, cylindrical, and the spherical scanning methods. Each has particular advantages for certain applications and has serious limitations in the maximum size of antenna that can be measured. For example, the planar method is best suited for high gain antennas, does not require the antenna under test to move, and uses a probe that scans a rectangular measurement plane immediately in front of the aperture. Probe scanners of this type are complex because the probe must be moved in two directions to cover the entire measurement (scan) plane. A planar scanner is extremely expensive to fabricate as it gets larger because of the high mechanical tolerances that must be maintained to obtain high quality measurement results. Planar scanners in use now are typically less than about 6 meters maximum dimension, although a few are larger.

Plane-polar scanners are similar in application to planar (plane-rectangular) scanners. They require the antenna to rotate about a single axis and use a probe that moves along a line perpendicular to and intersecting the antenna rotation axis. The combined motion produces a circular disc measurement surface immediately in front of the antenna aperture. This method can handle antennas large than the planar scanner but requires the antenna to be rotated. Again, as the antenna size grows, the method becomes very expensive and in fact, is not practicable for extemely large antennas. The largest antenna measured in this way was 20 meters in diameter. Also, the computation of the far field is a little more difficult because the data samples are distributed on concentric rings rather than on a rectangular grid.

In cylindrical scanning, the measurement plane is a cylinder surrounding the antenna and oriented coaxially with the rotation axis of the antenna. The probe moves along a line parallel to the rotation axis. Computation of the far fields is a little more complicated and time consuming than in planar scanning and since the method requires motion of the antenna, it is limited to the measurement of modest size antennas.

The spherical scanner is best suited for low gain antennas, requires the antenna under test to rotate about two orthogonal axes, and uses a stationary probe. The motion of the antenna relative to the stationary probe produces an apparent spherical measurement surface centered at the antenna. The method is limited to fairly small antennas because of the complex antenna rotation needed. Also, the computations required to obtain the far field are very much more complicated than the planar case and the computer running times may be prohibitive for large antennas.

Each of the four methods listed can not be applied to very large antennas of 30-100 meters or larger in size. For planar scanning, scanner construction to maintain the required tolerance is technically and financially prohibitive. For the other methods, the machinery necessary to rotate the antenna is similarly prohibitive. In addition, the superstructures required to support the measurement probe in the planar, plane-polar, and cylindrical methods can produce unwanted reflections that limit the accuracy of the measurement. In general, near-field scanning requires extremely careful mechanical alignment and the problems of maintaining this alignment are disproportionally increased with size.

OBJECTS OF THE INVENTION

It is therefore the primary object of the present invention to provide novel apparatus for measuring the near-field radiation of antennas.

It is a further object of the present invention to provide novel apparatus for measuring the near-field radiation of large antennas, which apparatus is relatively simple and inexpensive to construct while providing the required test stability tolerances and conditions.

It is yet another object of the present invention to provide an antenna near-field measuring device which does not require the antenna under test to move or be moved.

It is yet another object of the present invention to provide an antenna near-field measuring device which has no superstructure near the measurement probe that could produce unwanted reflections that limit the accuracy of the measurement.

It is yet another object of the present invention to provide an antenna near-field measurement system in which the measurement surface is on a sphere that does not contain and is completely external to the antenna.

SUMMARY OF THE INVENTION

The apparatus described and claimed herein utilizes a radiation sensing probe mounted on a Foucault pendulum suspended above the antenna under test, and electronic timing and measuring instrumentation associated with the probe. Scanning is achieved through the combination of a swinging pendulum mounted probe and the apparent rotation of the swing plane produce by the rotation of the earth. In basic terms, the earth functions as a turntable for the antenna under test while the probe systematically moves (swings or oscillates) over the antenna and samples the antenna's near-field radiation. The sampled data are thereafter used to compute the antennas far-field radiation pattern.

The foregoing objects and many of the attendant advantages of this invention will be readily appreciated as the invention becomes better understood by reference to the following detailed description when considered in connection with the accompanying drawings.

DETAILED DESCRIPTION OF THE INVENTION

Figure 1:
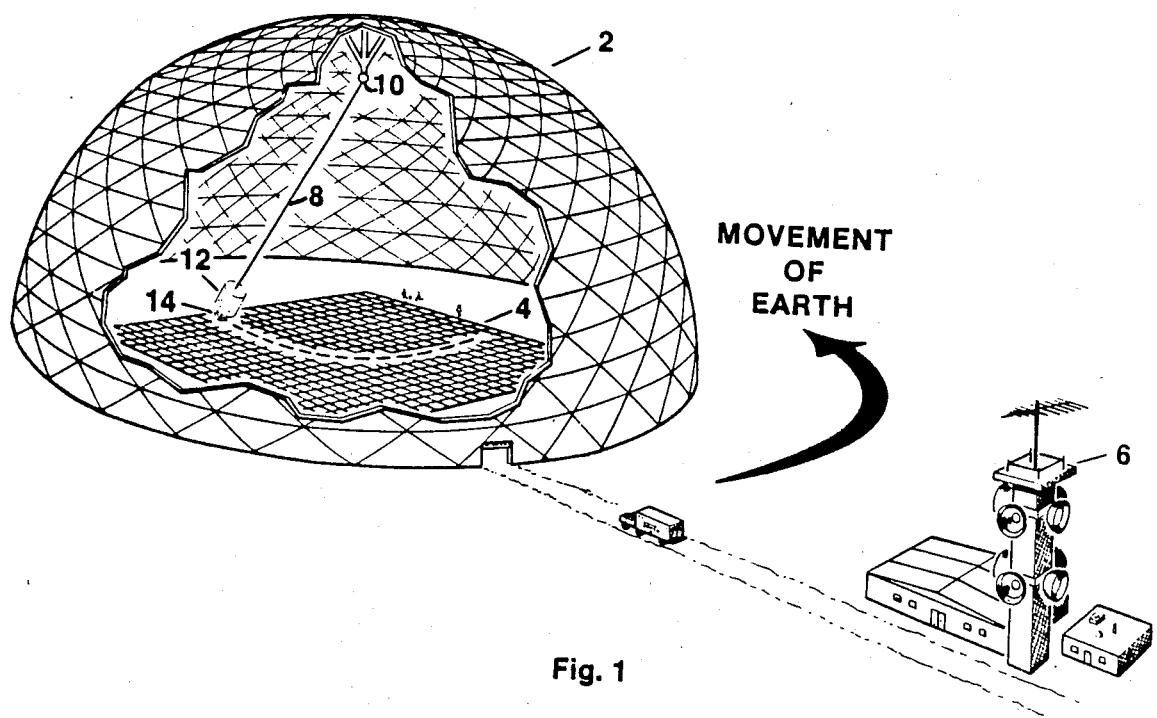
FIG. 1 is a pictorial representation of a large antenna measurement facility constructed in accordance with the preferred embodiment of the present invention.

Referring now to FIG. 1 of the drawings, there is illustrated an antenna test site which includes a geodesic dome 2 of sufficient size to shelter a large antenna 4 whose operational characteristics are to be tested. Radio frequency energy is applied to the antenna 4 and may be coupled thereto from a radio frequency source located in the dome structure 2 or in an adjacent building 6. A pendulum cable 8 is suspended from a pivot 10 located at the top of dome 2 and has a bob 12 which, in its rest position, is substantially centered at the boresight of antenna 4. The sizes of the various elements listed as bob 12 and probe 14 are not drawn to scale and are made much larger than normal with respect to the size of dome 2 in order to better illustrate the apparatus. Bob 12 contains a probe 14 adapted to sense electromagnetic energy and may also contain therein the electronic measuring equipment associated therewith. The details of the probe 14 and the associated measuring equipment are described in great detail below.

The pendulum described above is a form of spherical pendulum commonly known as a Foucault pendulum, which is mounted on a pivot 10 such that its motion is not confined to a plane. Its bob 12 moves over a spherical surface. If the pendulum were located at the North Pole, the rotation of the earth under the pendulum would make it appear to the terrestial observer that the plane of the pendulum motion rotated 360 degrees once every day and that its bob 12 moved over a spherical surface twice every day. If the pendulum is located at a lower latitude, the plane of pendulum motion rotates at a reduced rate, proportional to the sine of the latitude. It becomes evident that the pendulum bob 12, and therefore sensing probe 14 therein, will tranverse the scan surface immediately in front of the antenna under test 4 at a smooth and predictable rate.

Figure 2:
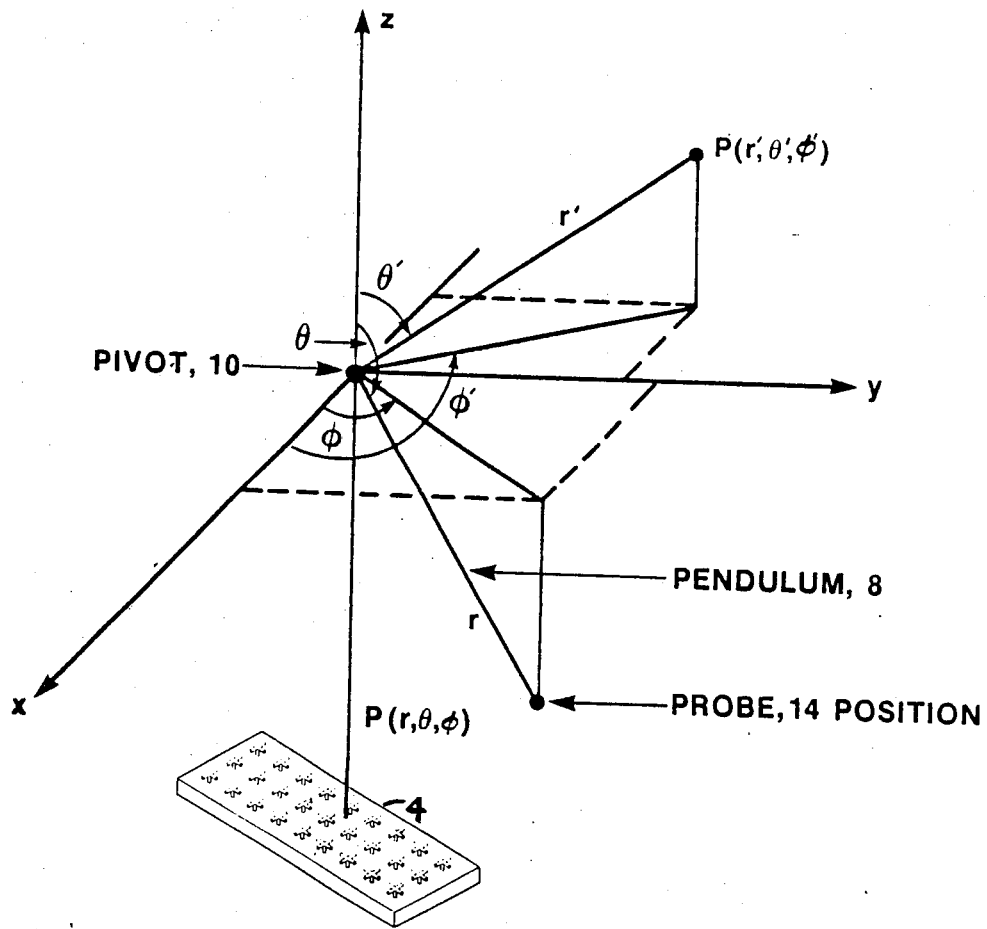
FIG. 2 is a delineation of the scanner coordinate system in which the equations are written.

A sketch of the scanner coordinate system associated with the motion of the bob 12 and probe 14 and appropriate for all the equations herein is shown in FIG. 2. The period of oscillation $T_\theta$ obtained from a power series solution of the equation of motion is $$T_\theta = (2\pi[r/g]^{\frac{1}{2}})(1 + 0.25 \sin^2\theta_o + 0.15 \sin^4\theta_o + \ldots) \qquad \text{Eq (1)}$$

where r is the length of the pendulum, g the acceleration of gravity, and $\theta_o$ the amplitude (maximum angle from the rest position) of the oscillation. When $\theta_o$ is sufficiently small, only the first term in Eq. (1) is retained and the motion is simple harmonic. The period $T_\phi$ (in hours) of apparent rotation of the plane of oscillation is $$T_\phi = 24/\sin L \qquad \text{Eq. (2)}$$

where L is the latitude of the location of the scanner pendulum.

For $\theta_o$ small, the angular displacement of the probe may be represented by $$\theta = \pi - \theta_o |\sin(2\pi t'/T_\theta)| \qquad \text{Eq. (3)}$$

and its angular velocity $\omega$ by $$\omega = (2\pi\theta_o/T_\theta)\cos|(2\pi t'/T_\theta)| \qquad \text{Eq. (4)}$$

with $t'=0$ taken at the instant the probe passes the center of the scanning surface (the rest position) at $\theta = \pi$. If the damping time constant is long compared to $T_\phi$, the motion described in Eq. (3) will persist during the entire near-field scanning period $T_s = T_\phi/2$. The last expression and the forms of Eqs. (3) and (4) result because during one period, the probe traverses two branches of the external sphere so that the entire surface is scanned in one half the period $T_\phi$. For one branch, $0 \leq \pi - \theta \leq \theta_o$ and $\phi = \phi_m$, while for the other, $0 \leq \pi - \theta \leq \theta_o$ and $\phi = \phi_m + \pi$.

As the probe 14 scans, samples of the electric field over the surface of the external sphere are collected. The angular increment between samples is $\Delta\theta = s/r$ where s is the maximum allowable arc length between sample points, often taken as one half wavelength of the measurement signal frequency. But since the probe velocity is not constant, the sampling time intervals $\Delta t$ that result in equal angle increments are not of equal length. Instead, sampling times are found from the expression $$t_n = (T_\theta/2\pi)\sin^{-1}(n\Delta\theta/\theta_o) \qquad \text{Eq. (5)}$$

for $0 \leq n \leq N$ where N is the nearest integer value of $r\theta_o/s$. For the moment, it is assumed that data is collected only on the outward going traverses. Thus, $n=0$ at $\theta = \pi$.

Similarly, the azimuthal sampling increment $\Delta\phi$ is $\Delta\phi = (r/s)\sin\theta_o$. The change in $\phi$ during one oscillation is $\delta\phi = T_\theta/(3600\ T_\phi)$. Since $\Delta\phi$ typically is very much larger than $\delta\phi$, $\phi$ may be considered constant over one oscillation period. However, selecting $\Delta\phi$ to give $s = \lambda/2$ at $\theta = \pi - \theta_o$, results in oversampling near $\theta = \pi$.

An open ended waveguide or low gain horn is often used as a probe (such as probe 14) in near-field scanners. In general, two orthogonal polarization components of the electric field must be measured so that the total vector far-field can ultimately be determined. The two measurements can be made on successive scans, successive oscillations, or simultaneously (with a dual polarized probe, for example).

Figure 3:
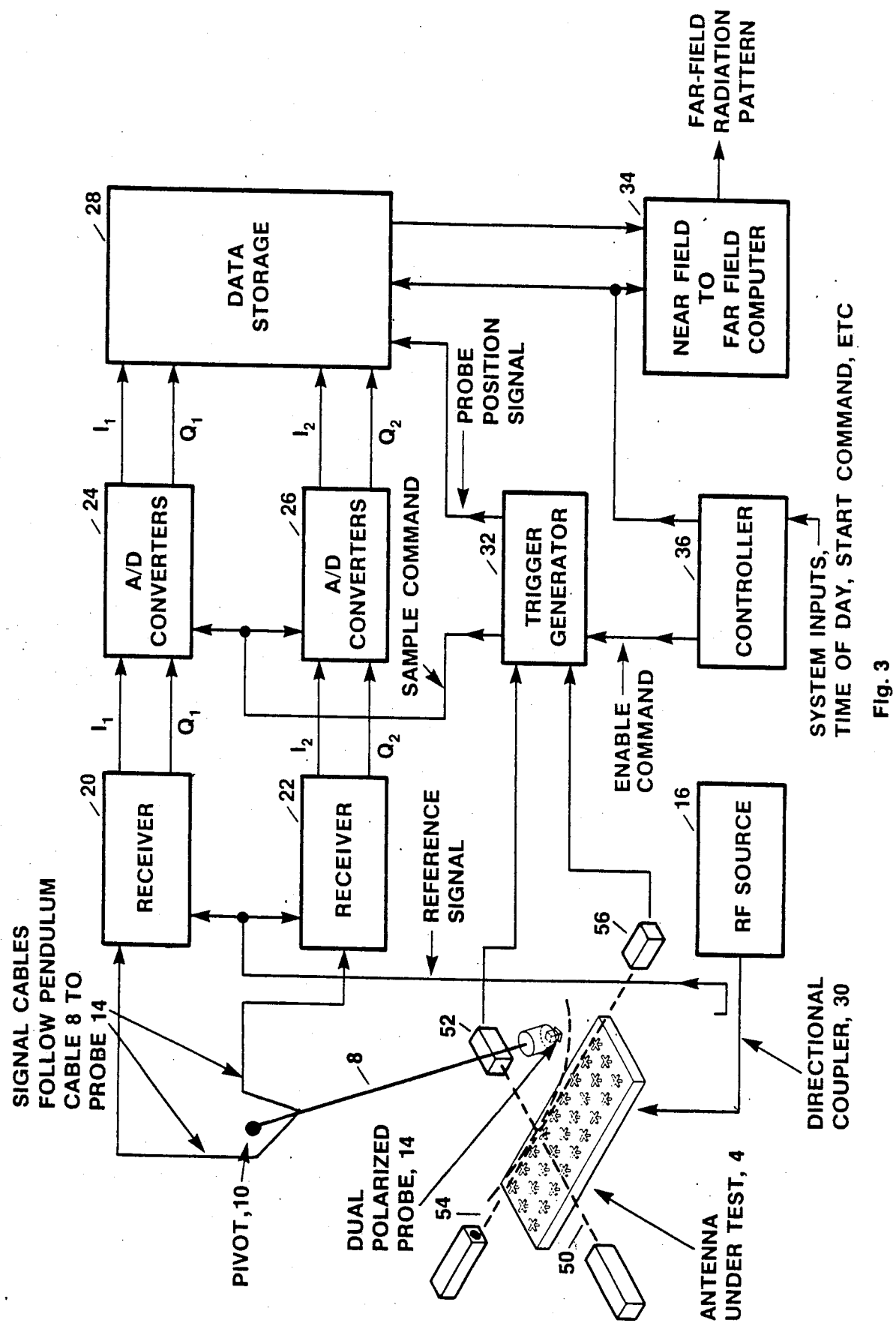
FIG. 3 is a block diagram representation of the instrumentation circuitry of the present invention.

FIG. 3 shows an instrumentation arrangement in which the two measurements are made simultaneously with a dual polarized probe 14. Two phase-amplitude receivers 20 and 22 receive the two orthogonal polarization signals from probe 14. The reference signals for the receivers are obtained from directional coupler 30 at the output of r.f. source 16. Their outputs $I_1$, $Q_1$ and $I_2$, $Q_2$ are sampled by the A/D converters 24 and 26 at times $t_n$ that correspond to selected values of $\theta_n$. The sampling commands for converter pairs 24 and 26 are obtained from the trigger generator 32. Digitized values of the phase and amplitude of the two polarization components provided by converter pairs 24 and 26 along with the values of n and m from trigger generator 32 for each sample are recorded and stored in data storage unit 28. The digitized values are hereafter used to form four data arrays that together give the complex electric near field at the sampling points $\theta_n$ and $\phi_m$ over the scanned surface of the external sphere. The azimuth angles $\phi_n$ of the oscillation plane at which samples are collected are selected by the enable commands generated by the controller 36. These are the near-field data that are later transformed by the near-field to far-field transformation computer 34 to obtain the antenna's far-field patterns and characteristics.

Figure 4:
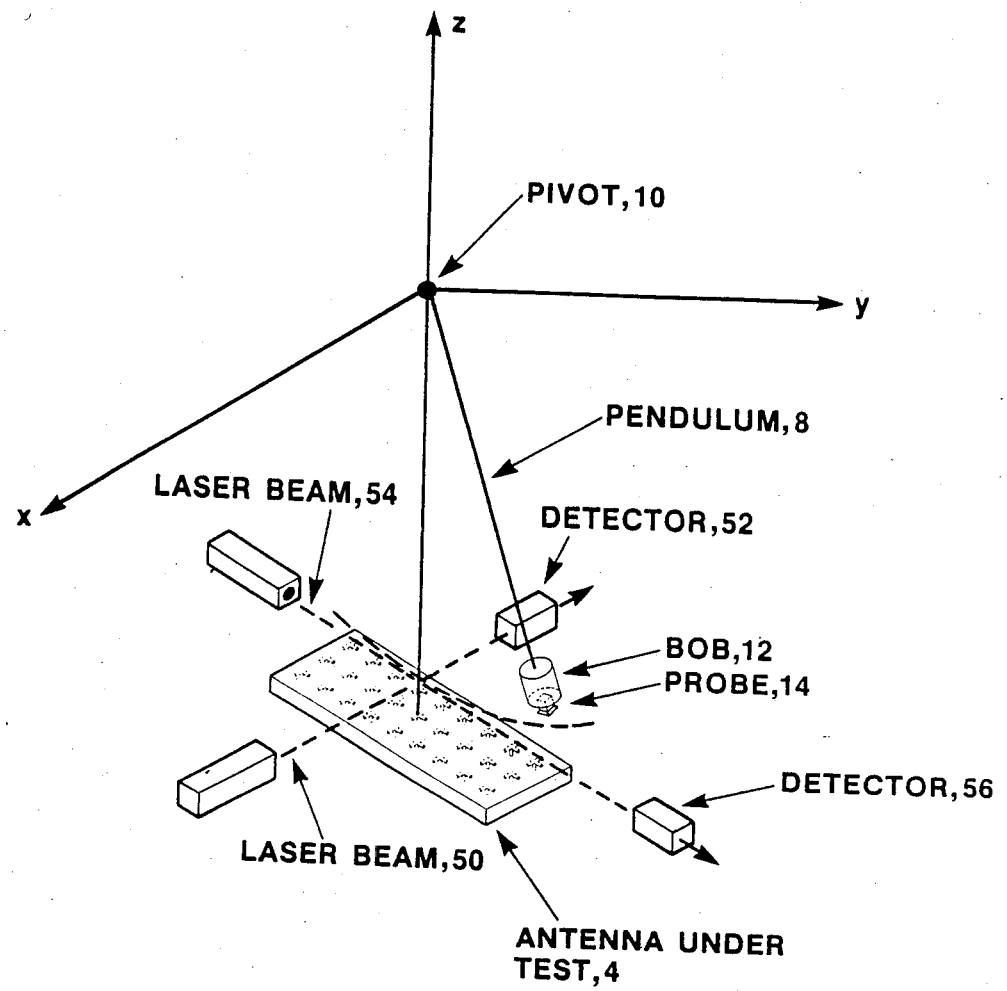
FIG. 4 is a diagram of the device arrangement used to measure the time of occurrence of the probe rest position and the velocity of the sensing probe on each swing.

To determine the instant $t_o=0$ when $n=0$ on every pass of the probe requires a sensor that identifies passage of the probe 14 through $\theta=\pi$. One way to accomplish this for a spherical or cylindrical bob is shown in FIG. 4. A laser beam 50 is aligned along the x axis to intersect the $\theta=\pi$ axis. As the bob 12 passes near the $\theta=\pi$ axis, it occults the laser beam 50 and produces a signal (lack of signal) in detector 52. The duration of the signal is proportional to the width and velocity of probe 14 as is passes. If $t_1$ and $t_2$ are the beginning and end times of the occulatation period, the time of day of probe passage through $\theta=\pi$ (along the y axis) for which $t_o=0$ and $n=0$ is $t_y=(t_{2y}+t_{1y})/2$. The detector 52 signal is fed to trigger generator 32 that computes $t_y$, from which the sampling commands for the A/D converter pairs 24 and 26 are obtained. The trigger generator 32 also provides the values n and m to the data storage unit 28 that must be recorded with the near-field samples.

It can be seen from FIG. 4 that laser beam 50 is occulted for long periods when the plane of the pendulum swing is near parallel to the x axis. For this reason, another laser beam 54 and detector 56 positioned along the y axis are provided from which $t_x=(t_{2x}+t_{1x})/2$ is obtained. In practice, the value for $t_o$ obtained from the detector that shows the smaller value for the difference $t_{2x}-t_{1x}$ or $t_{2y}-t_{1y}$ is selected by the trigger generator. This ensures the most accurate value for $t_o$.

Two additional system parameters must be obtained before the sampling times $t_n$ can be computed from Eq. (5). These are the period $T_\theta$ and the amplitude $\theta_o$ of the pendulum oscillation. These parameters are also computed in the trigger generator 32. The period $T_\theta$ is obtained as the difference $\Delta t$ in time between the two successive $\theta=\pi$ crossings. Thus, $T_\theta=2\Delta t$.

A property of the simple pendulum is that the period $T_\theta$ of its oscillation is independent of the amplitude $\theta_o$ of its swing. Thus $\theta_o$, needed to compute the sampling times $t_n$, cannot be obtained from the measurement of $T_\theta$. Instead $\theta_o$ is obtained indirectly by computing the bob angular velocity $\omega$ at $\theta=\pi$. The bob 12 and concentrically located probe 14 angular velocity $\omega$ is $$\omega = (D/r)[(t_{2x}-t_{1x}^{-2}+(t_{2y}-t_{1y})^{-2}]^{\frac{1}{2}} \quad \text{Eq.(6)}$$

where D is the diameter of the bob 12. From Eq. (4), the amplitude of oscillation is then obtained.

$$\theta_o = \omega T_\theta/2\pi \quad \text{Eq.(7)}$$

The computations of $t_o$, $T_\theta$, $\theta_o$, $\omega$, and $t_n$ are all carried out in the trigger generator 32 shown in FIG. 3. An additional requirement for initiating a sample command is that the probe 14 be traversing a branch $\phi_m$ where data are to be collected. The orientation $\phi(t)$ of the plane of rotation is given by $\phi(t)=\phi_o+2\pi(t-T)/T_\phi$ where T is the time of day at the start of the scan and $\phi_o$ is the swing plane orientation at the same time. The time $\Delta t_m$ between the enable signals is equal to the time required for the swing plane to rotate apparent angle $\Delta\phi$. Thus $\Delta t_m=\Delta\phi T_\phi/2\pi$ and the time (of day) of the enable signal is $$t_m = T + \Delta t_m \text{INT}[(t-T)/\Delta t_m] \quad \text{Eq. (8)}$$

where INT $[]=0$ except when its argument is an integer in which case it is equal to the integer. These enable commands are generated in the system controller 36. The enable command initiates an enable window that remains open for one complete swing period $T_\theta$ over which two sets of data samples (one for each branch) are collected.

The bandwidth of receivers 20 and 22 is selected on the basis of the absolute velocity of the probe 14. The response time $t_r$ must be short compared to the interval between data samples to insure that the correct value for the electric field is obtained. The narrower the bandwidth, the less is the noise power $N=kT_sB$ where K is Boltzmann's constant, $T_s$ the system noise temperature, and B the noise bandwidth. The faster the probe 14 moves, the wider the bandwidth required, and the lower the signal to noise ratio of the measurement. Setting $B=1/\Delta t_{min}=2\omega r/\lambda$, gives $$B >> 4\pi\theta_o r/\lambda T_\theta \quad \text{Eq. (9)}$$

The measured near-field data is stored in four arrays in data storage unit 28 that give the I and Q outputs for the two independent polarizations of the probe for every sample point $\phi_o \leq \phi_m \leq \phi_o+2\pi$ and $\pi \leq \theta_n \leq \pi-\theta_o$. Thus the probe signals can be represented by $$v_{nm}^q = (I_q^2+Q_q^2)^{\frac{1}{2}} \exp[j \tan^{-1}(Q_q/I_q)] \quad \text{Eq.(10)}$$

where q=1 or 2 for the two independent polarizations.

From the measured near-field data $v_{nm}^q$ one can compute the far fields of the test antenna. Specifically, if one defines the vector output $\overline{v_{nm}}$ of the probe by $$\overline{v_{nm}} = v_{nm}^1\hat{\phi} - v_{nm}^2\hat{\theta} \quad \text{Eq. (11)}$$

where $\hat{\phi}$ and $\hat{\theta}$ are unit vectors in the $\phi$ and $\theta$ directions respectively, then the electric field $\overline{F}$ of the test antenna can be written as $$\overline{F}(\theta',\phi') = (s^2\Delta\theta\Delta\phi/j\lambda) \quad \text{Eq. (12)}$$

$$\hat{r}' \times \sum_{n,m} \overline{v_{nm}}\exp[-jk\hat{r}' \cdot \overline{r}_{nm}]\sin\theta_m$$

where $\hat{r}'$ is the unit vector to the far-field point, $\overline{r}_{nm}$ is the position on the external scanning sphere. The double summation over n and m can be computed directly or by using the Fast Fourier Transform where greater speed may be desireable, especially for very large antennas. The calculations to obtain $v_{nm}{}^q$, $\bar{v}_{nm}$, and $\bar{F}(\theta', \phi')$ are carried out in the near-field to far-field computer 34. The principles of the calculations are discussed in the Paris et al and Joy et al references cited earlier herein.

The system controller 36 controls a measurement run. First, it accepts the operator inputs that describe the apparatus geometry and location, the time of day, T and $\phi_o$ that ultimately control the generation of the sample commands in the trigger generator 32. Second, it schedules the interlaced collection of the various data sets when, for example, measurements of several beam pointing directions are made during the same run. For this purpose, four data arrays must be formed for each beam position. In a completely automated system, the controller would also select the operating frequency for the system, schedule calibration measurements at appropriate times during the test run, and initiate the far-field pattern calculations.

The foregoing description provides an explanation for a new near-field antenna measurement apparatus that has potential for very large antennas. The description is based on simple models to illustrate the apparatus, method and the principles of its application. However, a number of additional comments on the apparatus and the technique are in order.

The equations of motion for the pendulum can be solved to any required accuracy even for arbitrarily large amplitudes, so that the restriction of small $\theta_o$, is strictly for convenience.

The size of the scanning area compared to the antenna aperture determines the angular extent of the far-field region where accurate results may be reasonably assumed. Specific relationships have been worked out (for planar scanning) that allow the size of this region to be computed from the particular near-field scanner geometry. (See the Yaghjian article listed earlier herein.) The same principles may be modified and applied to the present system.

Many methods of determining scanner motion, timing and synchronization are possible, ranging from the simple laser beam method described above, to more elaborate optically coded probe monitors, and even to data sorting techniques that may eliminate the necessity for direct probe position monitors.

A related issue is monitoring the exact position of the pivot point. An important feature of this technique is that the position of the single point is relatively easily measured with laser instrumentation. If the pivot point is sufficiently stable no correction is necessary. If not, the position of the point must be determined and recorded as a function of time so that the near-field data may be corrected before the far field is computed.

Because of the relatively slow motion of the probe 14, it is possible to interlace many independent near-field measurements during a total scan period. In general, the time between azimuth samples of one measurement is much greater than the pendulum swing period $T\theta$. Thus, on successive swing periods, the antenna can be scanned to a different direction, the operating frequency can be changed, or a different beam port can be measured. Then, the entire sequence can be repeated. The result is that a single measurement scan can be used to characterize the total for field of the antenna.

Although the invention has been described with reference to a particular embodiment, it will be understood to those skilled in the art that the invention is capable of a variety of alternative embodiments within the spirit and scope of the appended claims.

For example, the pendulum support could be independent of the enclosing structure making possible the use of inexpensive pressurized configurations. Also, the pendulum could be suspended over a natural or manmade depression such as a canyon or crater. This might simplify and reduce the height of the superstructure required to suspend the pendulum.

In addition the probe 14 may be a radiator (rather than a sensor) of electromagnetic energy which is received by the antenna under test. This mode of operation is required by some antennas.

The general design features of any configuration should include a bob as heavy as, a pendulum as long as, and a swing amplitude as small as possible. The torque produced by the pivot suspension 10 on the pendulum cable 8 should be minimized, otherwise the Foucault effect will be masked and scan in the $\phi$ direction will not occur. Also, the mechanical structure should be designed to maintain the position of pivot 10 accurately during a test run and to minimize environmental effects such as expansion of the pendulum cable 8 with temperature.

Under certain conditions, it may not be possible to maintain pendulum motion over the entire azimuth period $T_\phi$. For such cases, an escapement mechanism will have to be added to the system to add energy to the bob to make up for frictional and other energy losses.

What is claimed is:

1. Apparatus for scanning and thereby measuring the electromagnetic field produced by an antenna to determine its near-field radiation, comprising:

a body having an axial rotation and exhibiting a gravitational force;

means for disposing an antenna in a stationary position relative to said body;

means for applying radio frequency energy to said antenna for establishing an electromagnetic field above its radiating surface;

pendulum support structure disposed on said body;

a probe for sensing said electromagnetic field; and a Focault pendulum means supporting said probe and affixed to said pendulum support structure for suspending said probe above said radiating surface of said antenna;

said probe being free to scan a spherical segment of said body above said radiating surface of said antenna during axial rotation of said body.

2. Apparatus for scanning and thereby measuring the electromagnetic field produced by an antenna to determine its near-field radiation, comprising:

a body having an axial rotation and exhibiting a gravitational force;

means for disposing an antenna in a stationary position relative to said body;

a pendulum support structure disposed on said body;

a probe for radiating electromagnetic energy to said antenna;

a Foucault pendulum means supporting said probe and affixed to said pendulum support structure for suspending said probe above said antenna;

said probe being free to scan a spherical segment of said body above said radiating surface of said antenna during a full axial rotation of said body; and means for coupling radio frequency energy from said antenna related to the near-field response of said antenna 3. Apparatus as defined in claim 1 and further comprising:

timing means for determining the time of occurrence of said probe at its rest position and the velocity of said probe.

4. Apparatus as defined in claim 3 wherein said body is the earth and wherein said pendulum means is aligned with the boresight of said antenna when said pendulum means is in its rest position.

5. Apparatus as defined in claim 4 wherein said pendulum support structure is a geodesic dome enclosing said antenna and wherein said pendulum means is affixed to the apex of said geodesic dome enclosing said antenna.

6. Apparatus as defined in claim 3 wherein said timing means comprises:

a pair of orthogonal light beams each having an optical detector associated therewith;

said light beams crossing at the rest position of said probe;

said probe interrupting each of said orthogonal light beams when said probe is near said rest position to determine the time of occurrence of said rest position, the velocity of said probe at said rest position and the amplitude of the swing of said probe.

7. Apparatus as defined in claim 6 and further comprising:

means for externally stimulating the motion of said pendulum means to compensate for system energy losses.

* * * * *

UNITED STATES PATENT AND TRADEMARK OFFICE
CERTIFICATE OF CORRECTION

PATENT NO. : 4,704,614
DATED : November 3, 1987
INVENTOR(S) : J. Leon Poirier et al It is certified that error appears in the above-identified patent and that said Letters Patent is hereby corrected as shown below:

In column 1, on line 63, the word "large" should read --larger--.

In column 5, on line 65, in equation (6), after the term "$t_{1x}$", add a parenthesis mark --)--.

In column 6, on line 31, the term "K" should read --k--.

In column 7, on line 58, the word "aximuth" should read --azimuth--.

In column 7, on line 65, the word "for" should read --far--.

In column 8, on line 68, after the word "antenna", add a period --.--.

Signed and Sealed this

Twelfth Day of July, 1988

Attest:

DONALD J. QUIGG

*Attesting Officer*     *Commissioner of Patents and Trademarks*